United States Patent [19]

Watanabe et al.

[11] Patent Number: 4,831,626
[45] Date of Patent: May 16, 1989

[54] LASER BEAM RECORDING APPARATUS

[75] Inventors: Hideo Watanabe; Takashi Shoji, both of Kanagawa, Japan

[73] Assignee: Fuji Photo Film Co., Ltd., Kanagawa, Japan

[21] Appl. No.: 157,813

[22] Filed: Feb. 19, 1988

[30] Foreign Application Priority Data

Feb. 19, 1987 [JP] Japan .................................. 62-36587
Mar. 5, 1987 [JP] Japan .................................. 62-51001

[51] Int. Cl.$^4$ .............................................. H01S 3/13
[52] U.S. Cl. ...................................... 372/29; 369/33; 372/38
[58] Field of Search ........................... 372/29, 38, 24; 369/116, 33, 32, 44; 250/205; 346/108

[56] References Cited

U.S. PATENT DOCUMENTS

| | | | |
|---|---|---|---|
| 4,516,242 | 5/1985 | Yokota | 372/29 |
| 4,581,617 | 4/1986 | Yoshimoto et al. | 369/116 |
| 4,663,760 | 5/1987 | Shimada et al. | 372/38 |
| 4,710,779 | 12/1987 | Funaki et al. | 372/29 |
| 4,740,939 | 4/1988 | Kimura et al. | 369/33 |

FOREIGN PATENT DOCUMENTS 2841858 4/1979 Fed. Rep. of Germany ........ 372/24
0012853 1/1979 Japan ..................................... 372/24

Primary Examiner—Léon Scott, Jr.
Attorney, Agent, or Firm—Sughrue, Mion, Zinn, Macpeak & Seas

[57] ABSTRACT

A laser beam recording apparatus is provided with a laser operation control circuit for controlling a drive current for a semiconductor laser based on a light emission level instructing signal to modulate the optical intensity of a laser beam emitted by the semiconductor laser, an optical output stabilizing circuit for feeding a feedback signal corresponding to a detected intensity of the laser beam to the light emission level instructing signal, a gain adjuster provided in the optical output stabilizing circuit, and a gain controller for controlling the gain adjuster based on the light emission level instructing signal to compensate for fluctuations in a differential quantum efficiency of the semiconductor laser, and maintaining constant the gain of the optical output stabilizing circuit. Or, the laser operation control circuit is provided with the optical output stabilizing circuit, and a gain adjuster is provided in the optical output stabilizing circuit.

5 Claims, 4 Drawing Sheets

LASER BEAM RECORDING APPARATUS

BACKGROUND OF THE INVENTION

1. Field of the Invention

This invention relates to a laser beam recording apparatus for recording a continuous tone image on a photosensitive material by scanning the photosensitive material with a laser beam modulated in accordance with an image signal. This invention particularly relates to a laser beam recording apparatus for recording an image of high gradation by analog modulation of the optical intensity of the laser beam.

2. Description of the Prior Art

Light beam scanning recording apparatuses wherein a light beam is deflected by a light deflector and scanned on a photosensitive material for recording an image on the photosensitive material have heretofore been used widely. A semiconductor laser is one of the means used for generating a light beam in the light beam scanning recording apparatuses. The semiconductor laser has various advantages over a gas laser or the like in that the semiconductor laser is small, cheap and consumes little power, and that the laser beam can be modulated directly by changing the drive current.

FIG. 2 is a graph showing the optical output characteristics of the semiconductor laser with respect to the drive current. With reference to FIG. 2, the optical output characteristics of the semiconductor laser with respec to the drive current change sharply between a LED region (natural light emission region) and a laser oscillation region. Therefore, it is not always possible to apply the semiconductor laser to recording of a continuous tone image. Specifically, in the case where intensity modulation is carried out by utilizing only the laser oscillation region in which the optical output characteristics of the semiconductor laser with respect to the drive current are linear, it is possible to obtain a dynamic range of the optical output of only approximately 2 orders of magnitude at the most. As is well known, with a dynamic range of this order, it is impossible to obtain a continuous tone image having a high quality.

Accordingly, as disclosed in, for example, Japanese Unexamined Patent Publication Nos. 56(1981)-115077 and 56(1981)-152372, an attempt has been made to obtain a continuous tone image by maintaining the optical output of the semiconductor laser constant, continuously turning on and off the semiconductor laser to form a pulsed scanning beam, and controlling the number or the width of pulses for each picture element to change the scanning light amount.

However, in the case where the pulse number modulation or the pulse width modulation as mentioned above is carried out, in order to obtain a density scale, i.e. a resolution of the scanning light amount, of 10 bits (approximately 3 orders of magnitude) when the picture element clock frequency is 1 MHz for example, the pulse frequency must be adjusted to be very high (at least 1 GHz). Though the semiconductor laser itself can be turned on and off at such a high frequency, a pulse counting circuit or the like for control of the pulse number or the pulse width cannot generally be operated at such a high frequency. As a result, it becomes necessary to decrease the picture element clock frequency to a value markedly lower than the aforesaid value. Therefore, the recording speed of the apparatus must be decreased markedly.

Also, with the aforesaid method, the heat value of the semiconductor laser chip varies depending on the number or the widths of the pulses which are output during the recording period of each picture element, so that the optical output characteristics of the semiconductor laser with respect to the drive current change, and the exposure amount per pulse fluctuates. As a result, the gradation of the recorded image deviates from the correct gradation, and a continuous tone image of a high quality cannot be obtained.

On the other hand, as disclosed in Japanese Unexamined Patent Publication No. 56(1981)-71374 for example, it has been proposed to record a high-gradation image by combining pulse number modulation or pulse width modulation with optical intensity modulation. However, also with the proposed method, the heat value of the semiconductor laser chip varies depending on the number or the widths of the pulses which are output during the recording period of each picture element, so that the exposure amount per pulse fluctuates.

In view of the above, in order to record a high-gradation image of a density scale of approximately 10 bits, i.e. approximately 1024 levels of gradation, it is desired that a dynamic range of the optical output be adjusted to approximately 3 orders of magnitude by carrying out optical intensity modulation over the LED region and the laser oscillation region as shown in FIG. 2. However, the optical output characteristics of the semiconductor laser with respect to the drive current are not linear over the two regions. Therefore, in order to control the image density at an equal density interval for a predetermined difference among the image signals so that a high-gradation image can be recorded easily and accurately, it is necsssary to make linear the relationship between the light emission level instructing signal and the optical output of the semiconductor laser by compensation of the optical output characteristics of the semiconductor laser with respect to the drive current.

As a circuit for making linear the relationship between the light emission level instructing signal and the optical output of the semiconductor laser, it has heretofore been known to use an optical output stabilizing circuit (an automatic power control circuit, hereinafter abbreviated to the APC circuit) for detecting the optical intensity of a laser beam and feeding back a feedback signal, which corresponds to the detected optical intensity, to the light emission level instructing signal for the semiconductor laser. FIG. 3 is a block diagram showing an example of the APC circuit. The APC circuit will hereinbelow be described with reference to FIG. 3. A light emission level instructing signal Vref for instructing the optical intensity of a semiconductor laser 1 is fed to a voltage-to-current conversion amplifier 3 via an addition point 2. The amplifier 3 feeds a drive current proportional to the light emission level instructing signal Vref to the semiconductor laser 1. A laser beam 4 emitted forward by the semiconductor laser 1 is utilized for scanning a photosensitive material via a scanning optical system (not shown). On the other hand, the intensity of a laser beam 5 emitted rearward from the semiconductor laser 1 is detected by a pin photodiode 6 disposed for optical amount monitoring, for example, in a case housing the semiconductor laser 1. The intensity of the laser beam 5 thus detected is proportional to the intensity of the laser beam 4 actually utilized for image recording. The output current of the pin photodiode 6 which represents the intensity of the laser beam 5, i.e.

the intensity of the laser beam 4, is converted into a feedback signal (voltage signal) Vpd by a current-to-voltage conversion amplifier 7, and the feedback signal Vpd is sent to the addition point 2. From the addition point 2, a deviation signal Ve representing a deviation between the light emission level instructing signal Vref and the feedback signal Vpd is output. The deviation signal Ve is converted into a current signal by the voltage-to-current amplifier 3 and is utilized for operating the semiconductor laser 1.

In the case where the loop gain of the APC circuit as mentioned above is adjusted to be substantially high, the relationship between the light emission level instructing signal and the optical output of the semiconductor laser becomes linear.

The loop gain of the aforesaid APC circuit is determined by the gains of the amplifier included in the APC circuit, the photodetector and the semiconductor laser itself. As shown in FIG. 5, the gain, i.e. the differential quantum efficiency, of the semiconductor laser fluctuates in accordance with the optical output. Even though the differential quantum efficiency of the semiconductor laser fluctuates in this manner, the relationship between the light emission level instructing signal and the optical output of the semiconductor laser can be maintained linear in the case where the loop gain of the APC circuit is adjusted to be substantially high. However, on the other hand, the problems as described below arise.

Specifically, in the case where the differential quantum efficiency of the semiconductor laser is high, the gain of the APC circuit becomes high, the light emission response characteristics of the semiconductor laser become improved, and therefore the sharpness of the image is increased. However, in the case where the differential quantum efficiency of the semiconductor laser is low, the light emission response characteristics of the semiconductor laser are deteriorated, and therefore the sharpness of the image becomes low. Also, in this case, the relationship between the light emission level instructing signal and the optical output of the semiconductor laser cannot be maintained linear. In the case where a continuous tone image is recorded by modulating the light emission intensity of the semiconductor laser as mentioned above, a part exposed to the laser beam of a high intensity (a high density part in the case of a positive type photosensitive material) and a part exposed to the laser beam of a low intensity (a low density part in the case of the positive type photosensitive material) are naturally present in a single image. Therefore, when the differential quantum efficiency of the semiconductor laser fluctuates in accordance with the optical output as mentioned above, the sharpness changes between the high density part and the low density part in the image, and therefore the image quality is deteriorated.

SUMMARY OF THE INVENTION

The primary object of the present invention is to provide a laser beam recording apparatus wherein variations in the sharpness of a recorded image caused by fluctuations in the differential quantum efficiency of a semiconductor laser are prevented, and the relationship between the light emission level instructing signal and the optical output of the semiconductor laser is maintained linear.

Another object of the present invention is to provide a laser beam recording apparatus wherein variations in the loop gain of an APC circuit caused by differences in the differential quantum efficiency among semiconductor lasers and differences in the sensitivity among photodetectors such as photodiodes are eliminated, the relationship between the light emission level instructing signal and the optical output of the semiconductor laser is adjusted to a predetermined relationship without any difference among the laser beam recording apparatuses, and optical amount control is carried out accurately.

The present invention provides a first laser beam recording apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of the light emission level instructing signal, thereby to modulate the optical intensity of the laser beam, wherein the improvement comprises the provision of:
(i) an optical output stabilizing circuit for detecting the optical intensity of said laser beam, and feeding back a feedback signal corresponding to the detected optical intensity to said light emission level instructing signal,
(ii) a gain adjusting means provided in said optical output stabilizing circuit, and
(iii) a gain control means for controlling said gain adjusting means on the basis of said light emission level instructing signal to compensate for fluctuations in a differential quantum efficiency of said semiconductor laser, and maintaining the gain of said optical output stabilizing circuit approximately at a predetermined value.

The present invention also provides a second laser beam recording apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of the light emission level instructing signal, thereby to modulate the optical intensity of the laser beam, wherein the improvement comprises:
(i) providing said laser operation control circuit with an optical output stabilizing circuit for detecting the optical intensity of said laser beam, and feeding back a feedback signal corresponding to the detected optical intensity to said light emission level instructing signal, and
(ii) providing a gain adjusting means in said optical output stabilizing circuit.

With the first laser beam recording apparatus in accordance with the present invention, even though the optical output of the semiconductor laser is changed for the recording of a continuous tone image and the differential quantum efficiency of the semiconductor laser fluctuates, the gain of the APC circuit is maintained approximately at a predetermined value, and the light emission response characteristics of the semiconductor laser are maintained approximately constant. Therefore, the sharpness of the recorded image can be maintained approximately constant regardless of the image density. Also, the relationship between the light emission level instructing signal and the optical output of the semiconductor laser can be maintained linear, and a continuous tone image having a high image quality can be recorded.

With the second laser beam recording apparatus in accordance with the present invention wherein the aforesaid gain adjusting means is provided, the gain of the gain adjusting means can be adjusted to compensate for differences in the differential quantum efficiency among semiconductor lasers and differences in the sensitivity among photodetectors, thereby to adjust the loop gain of the APC circuit to a desired value. Accordingly, the relationship between the light emission level instructing signal and the optical output of the semiconductor laser can be adjusted to a predetermined relationship without any differecce among the laser beam recording apparatuses, and to be optical amount control can be carried out accurately. Also, it is possible to eliminate the problem that the loop gain of the APC circuit becomes higher than a designed value and the APC circuit gives rise to oscillation. Further, in the case where the loop gain of the APC circuit is adjusted uniform among the laser beam recording apparatuses, the light emission response characteristics of the semiconductor laser become uniform among the laser beam recording apparatuses. Therefore, the sharpness of the recorded image can be adjusted to a predetermined appropriate value, and the commercial value of the laser beam recording apparatus can be increased.

DESCRIPTION OF THE PREFERRED EMBODIMENTS

The present invention will hereinbelow be described in further detail with reference to the accompanying drawings.

Figure 1:
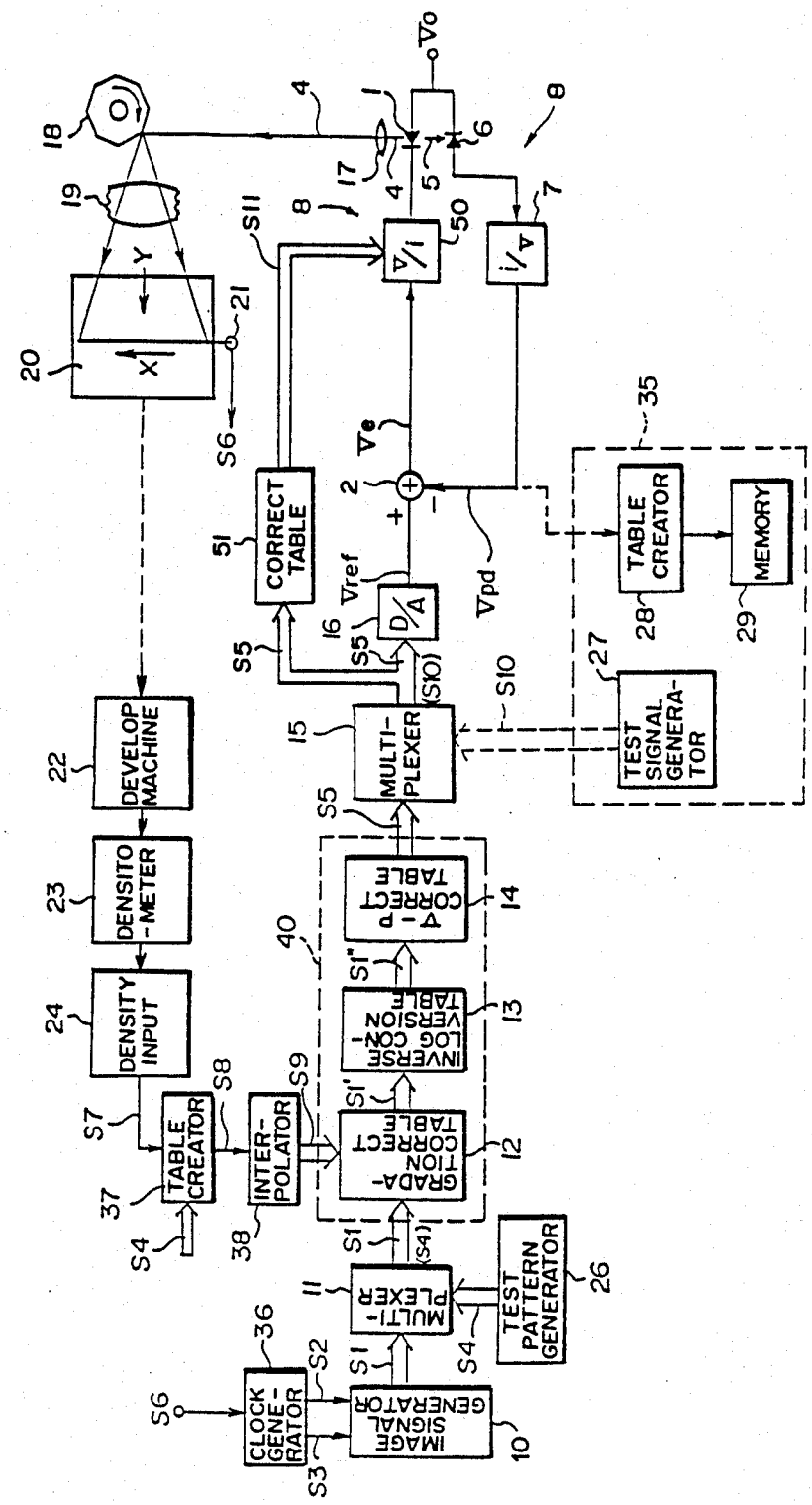
FIG. 1 is a schematic view showing an embodiment of the first laser beam, recording apparatus in accordance with the present invention.
Figure 2:
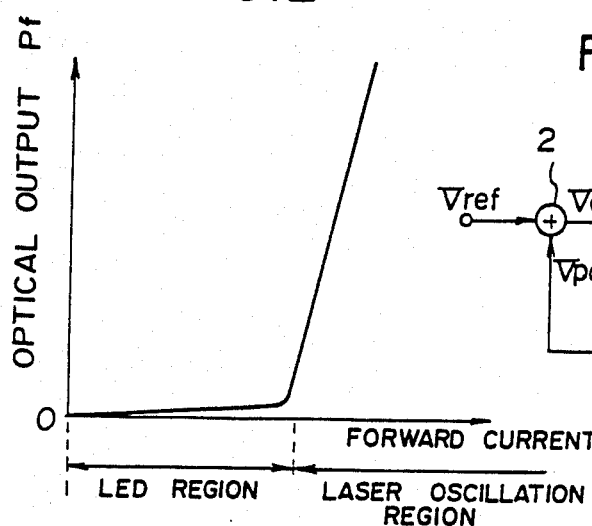
FIG. 2 is a graph showing the optical output characteristics of a semiconductor laser with respect to the drive current.

With reference to FIG. 1, an image signal generator 10 generates an image signal S1 representing a continuous tone image. By way of example, the image signal S1 is a digital signal representing a continuous tone image of a density scale of 10 bits. The image signal generator 10 changes over the signal for a single main scanning line on the basis of a line clock S2 as will be described later, and outputs the image signal S1 at each picture element based on a picture element clock S3. In this embodiment, the picture element clock frequency is adjusted to 1 MHz. In other words, the recording time for a single picture element is adjusted to 1 $\mu$sec.

Figure 3:
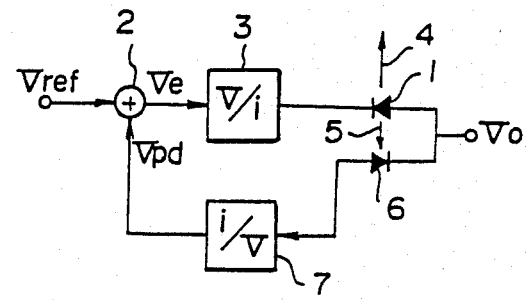
FIG. 3 is a block diagram showing an example of the circuit for stabilizing the optical output of the semiconductor laser.

The image signal S1 is corrected as will be described below by a correction table 40 comprising a RAM via a multiplexer 11, and is converted into a light emission level instructing signal S5 of 16 bits for example. The light emission level instructing signal S5 is fed to a multiplexer 15 and then to a D/A converter 116, and is converted by the D/A converter 16 into a light emission level instructing signal Vref composed of an analog voltage signal. The light emission level instructing signal Vref is fed to an addition point 2 of an APC circuit 8. A voltage-to-current conversion amplifier 50, a semiconductor laser 1, a photodiode 6, and a current-to-voltage conversion amplifier 7 of the APC circuit 8 respectively operate in the same manners as the voltage-to-current conversion amplifier 3, the semiconductor laser 1, the photodiode 6, and the current-to-voltage conversion amplifier 7 in the circuit mentioned above with reference to FIG. 3. Therefore, a laser beam 4 of an intensity corresponding to the light emission level instructing signal Vref, i.e. to the image signal S1, is emitted by the semiconductor laser 1. As one of the features of the present invention, the voltage-to-current conversion amplifier 50 is constituted as a programmable gain amplifier by use of a multiplication type D/A converter, and the gain of the voltage-to-current conversion amplifier 50 is variable. This feature will be described in detail later.

The laser beam 4 is collimated by a collimator lens 17, and is then reflected and deflected by a light deflector 18 constituted by a polygon mirror or the like. The laser beam 4 thus deflected is passed through a converging lens 19 normally constituted by an f$\theta$ lens, is converged into a minute spot on a photosensitive material 20, and scans the photosensitive material 20 in a main scanning direction as indicated by the arrow X. The photosensitive material 20 is moved by a movement means (not shown) in a sub-scanning direction as indicated by the arrow Y approximately normal to the main scanning direction X, and thus is scanned with the laser beam 4 in the sub-scanning direction Y. In this manner, the photosensitive material 20 is two-dimensionally scanned with and exposed to the laser beam 4. Since the laser beam 4 is intensity modulated based on the image signal S1 as mentioned above, the continuous tone image which the image signal S1 represents is recorded as a photographic latent image on the photosensitive material 20. When the laser beam 4 scans on the photosensitive material 20, passage of the laser beam 4 over a start point of the main scanning is detected by a photodetector 21, and a start point detection signal S6 generated by the photodetector 21 is fed to a clock generator 36. The clock generator 36 outputs the aforesaid line clock S2 and the picture element clock S3 in synchronization with the input timing of the start point detection signal S6.

Then, the photosensitive material 20 is sent to a developing machine 22 and is subjected to development processing. Thus the continuous tone image is developed as a visible image on the photosensitive material 20.

Correction of the image signal S1 by the correction table 40 will be described hereinbelow. The correction table 40 comprises a gradation correction table 12, an inverse logarithmic conversion table 13, and a correction table 14 (hereinafter referred to as the V-P characteristics correction table) for making linear the optical output characteristics of the semiconductor laser 1 with respect to the light emission level instructing signal. The gradation correction table 12 is of the known type for correcting the gradation characteristics of the photosensitive material 20 and the development processing system. The gradation correction table 12 may be of the fixed correction characteristics type. However, in this embodiment, by taking into consideration changes of the gradation characteristics of the photosensitive material 20 among the lots thereof, changes of characteristics of the developing solution in the developing machine 22 with passage of time, or the like, the gradation correction table 12 is constituted for changing the correction characteristics when necessary in accordance with actual gradation characteristics. Specifically, a test pattern signal S4 representing some steps (e.g. 16 steps) of image density on the photosensitive material 20 is generated by a test pattern generating circuit 26, and is fed to the multiplexer 11. At this time, the multiplexer 11 is changed over from the condition at the time of image recording for feeding the image signal S1 to the correction table 40 as mentioned above to the condition for feeding the test pattern signal S4 to the correction table 40. The semiconductor laser 1 is operated in the manner as mentioned above on the basis of the test pattern signal S4, and therefore the laser beam 4 is intensity modulated. As a result, a step wedge (test pattern) whose density changes step-wise, for example, in 16 steps, is recorded as a photographic latent image on the photosensitive material 20. The photosensitive material 20 is sent to the developing machine 22, and the step wedge is developed. After the development is finished, the photosensitive material 20 is sent to a densitometer 23, and the optical density at each step of the step wedge is measured. The optical density thus measured is sent to a density value input means 24 in conformity with each step of the step wedge, and a density signal S7 representing the optical density of each step of the step wedge is generated by the density value input means 24. The density signal S7 is fed to a table creation means 37. On the basis of the density signal S7 and the test pattern signal S4, the table creation means 37 creates the gradation correction table such that predetermined image density is obtained with a predetermined value of the image signal S1. As mentioned above, the gradation correction table mkkes the image signal values of approximately 16 steps correspond respectively to predetermined image density values. A signal S8 representing the gradation correction table is fed to a signal interpolation means 38, which carries out interpolation processing to obtain a gradation correction table adapted to the image signal S1 of 1024 steps (i.e. 10 bits). The aforesaid gradation correction table 12 is created on the basis of a signal S9 representing the thus obained gradation correction table.

In the course of image recording based on the image signal S1, the image signal S1 fed to the gradation correction table 12 via the multiplexer 11 is converted to a signal S1' by the gradation correction table 12, and is then converted by the inverse logarithmic conversion table 13 into a light emission level instructing signal S1".

Figure 4:
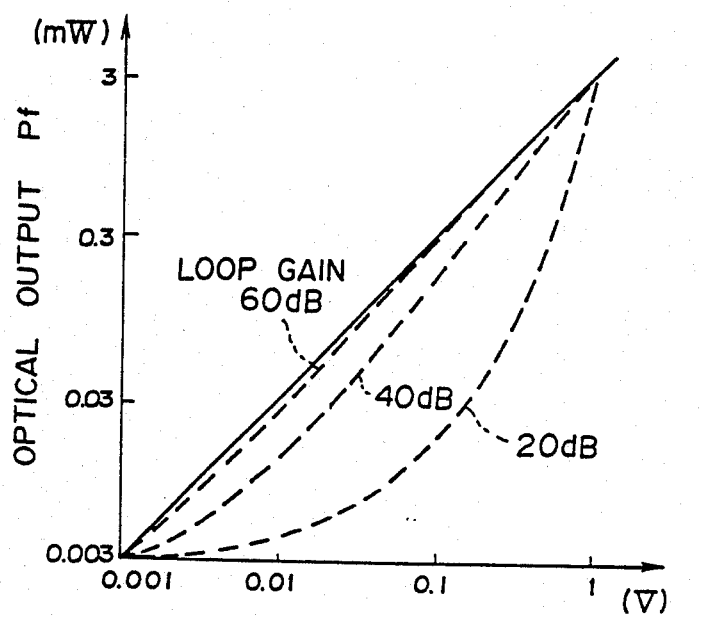
FIG. 4 is a graph showing the relationship between a light emission level instructing signal and the optical output of the semiconductor laser.

The V-P characteristics correction table 14 will now be described below. Even though the APC circuit 8 comprising the photodiode 6 and the currett-to-voltage conversion amplifier 7 is provided and the feedback signal Vpd is fed back to the addition point 2, it is not always possible to obtain the ideal relationship between the light emission level instructing signal and the intensity of the laser beam 4 as indicated by the solid line in FIG. 4. Specifically, in order to obtain the ideal relationship, it is necessary to adjust the loop gain of the APC circuit to a very high value (approximately 70 dB). However, it is not always possible to realize such a high loop gain with the present technique. The V-P characteristics correction table 14 is provided for obtaining such an ideal relationship. Specifically, the ideal relationship between the light emission level instructing signal Vref and the optical output of the semiconductor laser 1 is indicated by a straight line "a" in FIG. 6, the actual relationship therebetween is indicated by a curve "b" in FIG. 6, and the voltage value at the time the light emission level instructing signal S1" is directly D/A converted is assumed to be equal to Vin. In this case, the V-P characteristics correction table 14 is constituted to convert the voltage value Vin to a voltage value V. When the value of the light emission level instructing signal Vref is equal to Vin, only the optical intensity equal to P' can be obtained. However, in the case where the voltage value Vin is converted to the voltage value V as mentioned above, the optical intensity equal to Po can be obtained with respect to the voltage value Vin. Thus the relationship between the voltage value Vin corresponding to the light emission level instructing signal S1" and the optical output Pf becomes linear.

With the aforesaid configuration, density on the photosensitive material 20 can be controlled at equal density intervlls by changing the level of the image signal S1 by a predetermined amount. Also, as mentioned above, the characteristic curve "b" shown in FIG. 6 is for the case where the semiconductor laser 1 is operated over the LED region and the laser oscillation region. Therefore, with the aforesaid embodiment, an optical output dynamic range of approximately 3 orders of magnitude can be obtained, and consequently a high-gradation image of approximately 1024 levels of gradation can be recorded easily and accurately as mentioned above.

As mentioned above, nonlinearity of the laser beam optical output characteristics with respect to the light emission level instructing signal, which nonlinearity is caused by nonlinearity of the optical output characteristics of the semiconductor laser 1 with respect to the drive current, is eliminated and said characteristics are made linaar by the V-P characteristics correction table 14. Accordingly, the loop gain of the system of the APC circuit 8 passing through the addition point 2, the voltage-to-current conversion amplifier 50, the semiconductor laser 1, the photodiode 6, and the current-to-voltage conversion amplifier 7 and then returning to the addition point 2 need not include the gain necessary for the correction for eliminating the aforesaid nonlinearity. Thus it is only necessary that the loop gain be of a value required for the compensation for deviations of the optical output characteristics of the semiconductor laser 1 with respect to the drive current which are caused by transitional changes in the temperauure arising in the course of the operation of the semiconductor laser 1 or by error in the control for making constant the temperature in the case of the semiconductor laser 1, and for the compensation for drifts of the amplifiers or the like. Specifically, in the case where the picture element clock frequency is 1 MHz and the semiconductor laser 1 is operated to generate an optical output of 3mW, it is only necessary that the aforesaid loop gain be approximately 30 dB. The loop gain of this order can be achieved easily with the present technical level.

Figure 6:
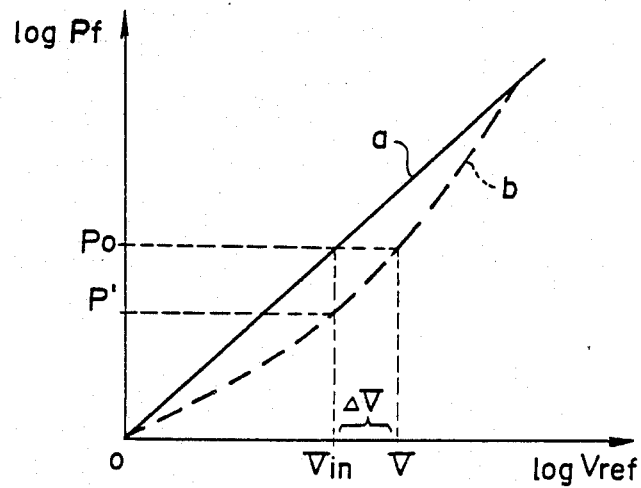
FIG. 6 is an explanatory graph showing the effects of the V-P characteristics correction table in the embodiment shown in FIG. 1.

Creation of the V-P characteristics correction table 14 will be described hereinbelow. To the apparatus shown in FIG. 1, a table creation device 35 can be connected when necessary. The table creation device 35 comprises a test signal generating circuit 27, a table creation circuit 28 and a memory 29. When the V-P characteristics correction table 14 is to be created, a variable-level digital test signal S10 is generated by the test signal generating circuit 27 and is fed to the multiplexer 15. At this time, the multiplexer 15 is changed over from the condition for feeding the light emission level instructing signal S5 to the D/A converter 16 in the course of image recording to the condition for feeding the test signal S10 to the D/A converter 16. Also, the table creation circuit 28 is connected so that it receives the feedback signal Vpd from the current-to-voltage conversion amplifier 7 of the APC circuit 8. The test signal S10 is output such that the signal level increases or decreases step-wise. At this time, the table creation circuit 28 activates a variable-level signal generator built therein to generate a reference signal corresponding to the minimum optical output, and compares the feedback signal Vpd with the reference signal. The reference signal has the voltage value Vin as shown in FIG. 6. The table creation circuit 28 latches the value of the test signal S10 at the time the feedback signal Vpd and the reference signal coincide with each other. The voltage value represented by the latched test signal S10 corresponds to the voltage value V as shown in FIG. 6, and therefore the relationship between the voltage value Vin and the voltage value V can be found. The table creation circuit 28 changes the value of the reference signal in 1024 steps, and detects the relationship between the voltage value Vin and the voltage value V for each reference signal value. In this manner, the correction table for converting 1024 levels of the voltage value Vin to the voltage value V is created. The creation table thus created is stored in the memory 29, and is then set as the V-P characteristics correction table 14. After the V-P characteristics correction table 14 is created in this manner, the table creation device 35 is disconnected from the APC circuit 8.

Figure 5:
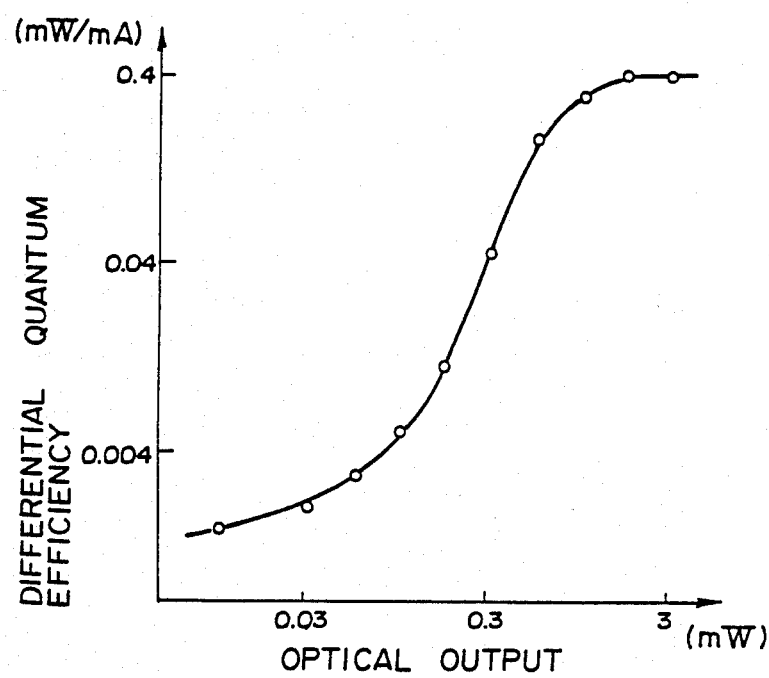
FIG. 5 is a graph showing the relationship between the optical output of the semiconductor laser and the differential quantum efficiency.

The gain control of the voltage-to-current conversion amplifier 50 will be described hereinbelow. The light emission level instructing signal S5 passing through the V-P characteristics correction table 14 is fed to a gain correction table 51. The gain correction table receives the light emission level instructing signal S5, and outputs a signal S11 representing the reciprocal value of the differential quantum efficiency as shown in FIG. 5 that corresponds to the optical output of the semiconductor laser 1 represented by the light emission level instructing signal S5. The signal S11 representing the reciprocal value is fed to the voltage-to-current conversion amplifier 50 constituted as the programmable gain amplifier. Upon receiving the reciprocal value signal S11, the voltage-to-current conversion amplifier 50 adjusts the gain to a value proportional to the reciprocal value represented by the reciprocal value signal S11. As shown in FIG. 5, the differential quantum efficiency, i.e. the gain, of the semiconductor laser 1 fluctuates in accordance with the optical output of the semiconductor laser 1. However, in the case where the gain of the voltage-to-current conversion amplifier 50 is controlled in the manner as mentioned above, the total gain of the laser operation control circuit including the APC circuit 8 is maintained approximately at a predetermined value regardless of the optical output of the semiconductor laser 1. As a result, the light emission response characteristics of the semiconductor laser 1 become approximately constant regardless of the optical output of the semiconductor laser 1. Therefore, the sharpness of the image recorded on the photosensitive material 20 is maintained approximately on a predetermined level in both cases where the optical output of the semiconductor laser 1 is comparatively high (when a high density part is recorded in the case where the photosensitive material 20 is of the negative type), and where the optical output of the semiconductor laser 1 is comparatively low (when a low density part is recorded in the case where the photosensitive material 20 is of the negative type).

In the aforesaid embodiment, the V-P characteristics correction table 14 for making linear the relationship between the light emission level instructing signal S1″ and the optical output Pf is provided. However, in the case where the gain of the APC circuit 8 is adjusted to be substantially high (for example, approximately 70dB), the ideal relationship as indicated by the solid line in FIG. 4 can be obtained by the APC circuit 8 alone, the V-P characteristics correction table 14 as mentioned above need not necessarily be provided.

Also, the beam scanning system for scanning the laser beam 4 is often provided with an optical element whose optical transmittance characteristics with respect to the incident light intensity are nonlinear, for example, a polarizing filter, an interference filter, or an aperture stop plate. In such a case, the V-P characteristics correction table 14 should preferably be formed to compensate also for the nonlinearity of such characteristics.

Also, in the aforesaid embodiment, the voltage-to-current conversion amplifier 50 is constituted as the programmable gain amplifier. However, the voltage-to-current conversion amplifier 50 may also be constituted by a constant-gain amplifier. In this case, an amplifier for amplifying the voltage signal prior to the input to the voltage-to-current conversion amplifier 50 may be provided, said amplifier may be constituted as, for example, a programmable gain amplifier, thereby to compensate for fluctuations in the differential quantum efficiency of the semiconductor laser 1.

Figure 7:
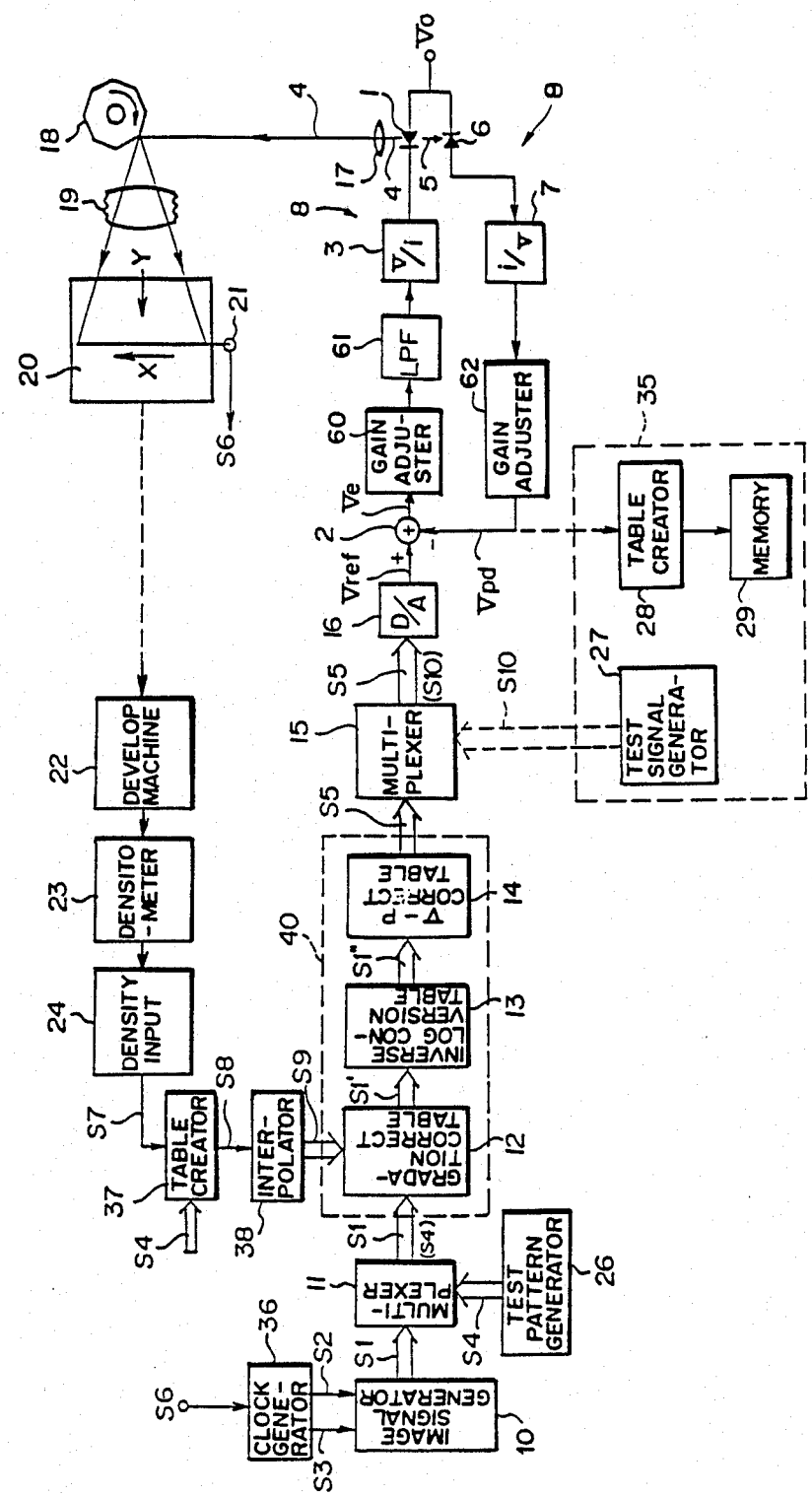
FIG. 7 is a schematic view showing an embodiment of the second laser beam recording apparatus in accordance with the present invention.

An embodiment of the second laser beam recording apparatus in accordance with the present invention will be described hereinbelow with reference to FIG. 7. In FIG. 7, similar elements are numbered with the same reference numerals with respect to FIG. 1. In this ebbodiment, the voltage-to-current conversion amplifier 3, the semiconductor laser 1, the photodiode 6, and the current-to-voltage conversion amplifier 7 of the APC circuit 8 respectively operate in the same manners as the voltage-to-current conversion amplifier 3, the semiconductor laser 1, the photodiode 6, and the current-to-voltage conversion amplifier 7 in the circuit mentioned above with reference to FIG. 3. Therefore, the laser beam 4 of an intensity corresponding to the light emission level instructing signal Vref, i.e. to the image signal S1, is emitted by the semiconductor laser 1. In this embodiment, unlike the circuit shown in FIG. 3, a gain adjusting means 60 and a low-pass filter 61 are provided in this order on the line from the addition point 2 to the voltage-to-current conversion amplifier 3. Also, a gain adjusting means 62 is provided on the line from the current-to-voltage conversion amplifier 7 to the addition point 2.

The technique of adjusting the loop gain of the APC circuit 8 to a predetermined value in the embodiment shown in FIG. 7 will be described hereinbelow. Each of the gain adjusting means 60 and the gain adjusting means 62 is an attenuator comprising, for example, a trimmer resistor. The loop gain of the APC circuit 8 is changed by the adjustment of the gain adjusting means 60 and the gain adjusting means 62. Particularly, in this embodiment, variations in the sensitivity of the photodiode 6 are eliminated by the gain adjusting means 62. In the course of the adjustment of the sensitivity, instead of the light emission level instructing signal Vref, a variable-level test signal Vtes is fed. The test signal Vtes is fed by, for example, utilizing the aforesaid test signal generating circuit 27. At this time, the optical intensity of the laser beam 4 is measured by use of, for example, an optical power meter, and the value of the test signal Vtes is adjusted so that a predetermined optical intensity Ptes is obtained. Also, the feedback signal Vpd fed out of the gain adjusting means 62 is monitored and, at the same time, the gain adjusting means 62 is adjusted so that the relationship between the feedback signal Vpd and the optical intensity Ptes becomes a predetermined relationship. In this manner, variations in the sensitivity of the photodiode 6 are compensated for.

After the aforesaid adjustment is carried out, the adjustment for setting the loop gain of the APC circuit 8 to a predetermined value by the gain adjusting means 60 is carried out. In the course of this adjustment, the predetermined light emission level instructing signal Vref is fed to the addition point 2, and the output from the addition point 2, i.e. the deviation signal Ve, is monitored. When the loop gain of the APC circuit 8 is designated by Go, the formula $$Ve = Vref/(1+Go)$$

holds. Therefore, the gain adjusting means 60 is adjusted so that the deviation signal Ve satisfying said formula is obtained. The adjustment may also be achieved by feeding a step input as the light emission level instructing signal Vref, and observing the overshoot amount and the overshoot time. The adjustment of the loop gain must be carried out in the laser oscillation region wherein the differential quantum efficiency of the semiconductor laser 1 is high.

In order to adjust the loop gain more accurately to the predetermined value, the loop of the APC circuit 8 may be opened between the gain adjusting means 62 and the addition point 2 after the compensation for variations in the sensitivity of the photodiode 6 is carried out. In this case, a sine wave is superposed upon the light emission level instructing signal Vref, the amplitude of the sine wave appearing in the feedback signal Vpd and the amplitude of the aforesaid sine wave superposed upon the light emission level instructing signal Vref are compared with each other, and the gain adjusting means 60 is adjusted so that the ratio between the two amplitudes becomes equal to a desired loop gain.

As mentioned above with reference to the embodiment shown in FIG. 1, the V-P characteristics correction table 14 need not necessarily be provided also in the embodiment shown in FIG. 7.

Also, in the embodiment shown in FIG. 7, in the case where the beam scanning system for scanning the laser beam 4 is provided with an optical element whose optical transmittance characteristics with respect to the incident light intensity are nonlinear, for example, a polarizing filter, an interference filter, or an aperture stop plate, the V-P characteristics correction table 14 should preferably be formed to compensate also for the nonlinearity of such characteristics.

In the embodiment shown in FIG. 7, the gain adjusting means 60 and the gain adjusting means 62 are provided. However, the second laser beam recording apparatus in accordance with the present invention may be provided with a single gain adjusting means, or three or more gain adjusting means.

We claim:

1. A laser beam recording apparatus for recording an image on photosensitive material in accordance with an input image signal, said apparatus including a semiconductor laser for emitting a laser beam, a beam scanning system for scanning the laser beam on said photosensitive material, and a laser operation control circuit for producing a light emission level instructing signal corresponding to said input image signal, and controlling a drive current for the semiconductor laser in accordance with the light emission level instructing signal, thereby to modulate the optical intensity of the laser beam, wherein the improvement comprises:

(i) an optical output stabilizing circuit for detecting the optcial intensity of said laser beam, and feeding back a feedback signal corresponding to the detected optical intensity to said light emission level instructing signal to stabilize the optical intensity of said laser beam, (ii) a gain adjusting means, provided in said optical output stabilizing circuit, for adjusting a gain of said optical output stabilizing circuit, and (iii) a gain control means for controlling said gain adjusting means in accordance with said light emission level instructing signal to compensate for fluctuations in a differential quantum efficiency of said semiconductor laser, and maintaining the gain of said optical output stabilizing circuit approximately at a predetermined value.

2. An apparatus as defined in claim 1 wherein said gain adjusting means comprises a programmable gain amplifier.

3. An apparatus as defined in claim 2 wherein said gain control means comprises a gain correction table for receiving said light emission level instructing signal, generating a reciprocal value signal which represents a reciprocal value of the differential quantum efficiency corresponding to the optical output of said semiconductor laser represented by said light emission level instructing signal, and feeding said reciprocal value signal to said gain adjusting means, thereby to have said gain adjusting means adjust the gain to a value proportional to said reciprocal value.

4. An apparatus as defined in claim 1 wherein said gain control means comprises a gain correction table for receiving said light emission level instructing signal, generating a reciprocal value signal which represents a reciprocal value of the differential quantum efficiency corresponding to the optical output of said semiconductor laser represented by said light emission level instructing signal, and feeding said reciprocal value signal to said gain adjusting means, thereby to have said gain adjusting means adjust the gain to a value proportional to said reciprocal value.

5. An apparatus as defined in any of claims 1 or 3 wherein said laser operation control circuit is provided with a correction table for correcting said light emission level instructing signal to selectively provide one of a corrected light emission level instructing signal and an uncorrected light emission level instructing signal so as to compensate for nonlinearity of optical output characteristics of said semiconductor laser with respect to the drive current, thereby to make linear the relationship between the optical output of said semiconductor laser based on said corrected light emission level instructing signal and said uncorrected light emission level instructing signal.

* * * * *